United States Patent
Umino et al.

(10) Patent No.: US 9,481,751 B2
(45) Date of Patent: Nov. 1, 2016

(54) CURABLE RESIN, METHOD OF PRODUCING THE SAME, AND CURED PRODUCT

(71) Applicant: GUNEI CHEMICAL INDUSTRY CO., LTD., Takasaki-shi, Gunma (JP)

(72) Inventors: Youhei Umino, Takasaki (JP); Satoru Kitano, Takasaki (JP); Yukio Abe, Takasaki (JP)

(73) Assignee: GUNEI CHEMICAL INDUSTRY CO., LTD., Takasaski-shi (JP)

( * ) Notice: Subject to any disclaimer, the term of this patent is extended or adjusted under 35 U.S.C. 154(b) by 0 days.

(21) Appl. No.: 14/744,630

(22) Filed: Jun. 19, 2015

(65) Prior Publication Data

US 2015/0284491 A1 Oct. 8, 2015

Related U.S. Application Data

(63) Continuation of application No. PCT/JP2013/083683, filed on Dec. 16, 2013.

(30) Foreign Application Priority Data

Dec. 21, 2012 (JP) ................................ 2012-280194

(51) Int. Cl.
C08F 12/24 (2006.01)
C08F 8/00 (2006.01)
C08F 212/08 (2006.01)

(52) U.S. Cl.
CPC ............ *C08F 212/08* (2013.01); *C08F 12/24* (2013.01); *C08F 8/00* (2013.01)

(58) Field of Classification Search
CPC ............ C08F 8/00; C08F 8/28; C08F 12/12; C08F 12/08; C08F 12/24; C08F 212/08; C08F 212/12; C08F 212/14; C08J 2325/04; C08J 2325/16; C08J 2325/18; C08L 25/16; C08L 25/18; C08K 5/07
USPC .................................. 525/328.8, 333.3, 383
See application file for complete search history.

(56) References Cited

FOREIGN PATENT DOCUMENTS

| CN | 1711290 A | 12/2005 |
|---|---|---|
| JP | 56-031405 A | 3/1981 |
| JP | 61-076513 A | 4/1986 |
| JP | 2-170165 | * 6/1990 |
| JP | 02-170165 A | 6/1990 |
| JP | 04-018413 A | 1/1992 |
| JP | H05-158232 | 6/1993 |
| JP | H07-140648 | 6/1995 |
| JP | 2007-065488 A | 3/2007 |
| JP | 2008-304902 A | 12/2008 |
| TW | 538054 | 6/2003 |

OTHER PUBLICATIONS

English translation of JP 2-170165, Jun. 1990.*
Office Action mailed Dec. 17, 2014 by the Taiwan Intellectual Property Office in connection with Taiwanese Patent Application No. 102147474.
Notification Concerning Transmittal of International Preliminary Report on Patentability (Chapter I of the Patent Cooperation Treaty), including an International Preliminary Report on Patentability and Written Opinion of the International Searching Authority, mailed Jul. 2, 2015 by the International Bureau of WIPO in connection with PCT International Application No. PCT/JP2013/083683, filed Dec. 16, 2013.
International Search Report mailed by the International Searching Authority (ISA/JP) on Mar. 18, 2014 in connection with PCT International Application No. PCT/JP2013/083683, filed Dec. 16, 2013.
Written Opinion of the International Searching Authority mailed by the International Searching Authority (ISA/JP) on Mar. 18, 2014 in connection with PCT International Application No. PCT/JP2013/083683, filed Dec. 16, 2013.
Chinese Official Action (and English translation) dated Jun. 27, 2016 by the State Intellectual Property Office in connection with couterpart Chinese Patent Application No. 201380067453.X.

* cited by examiner

*Primary Examiner* — Roberto Rabago
(74) *Attorney, Agent, or Firm* — John P. White; Cooper & Dunham LLP

(57) ABSTRACT

A curable resin including a repeating unit of hydroxystyrene substituted with an alkoxymethyl group, the repeating unit represented by the following general formula (1):

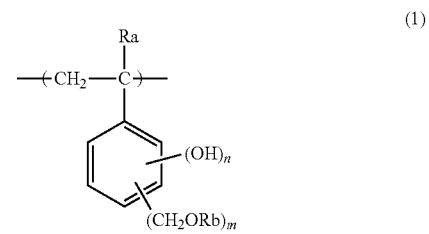

where Ra represents a hydrogen atom or a methyl group; Rb represents a hydrogen atom or an alkyl group having 1 to 4 carbon atoms; m is 1 to 3; and n is 1 to 3.

2 Claims, No Drawings

CURABLE RESIN, METHOD OF PRODUCING THE SAME, AND CURED PRODUCT

CROSS-REFERENCE TO RELATED APPLICATIONS

This application is a Continuation Application of PCT Application No. PCT/JP2013/083683, filed Dec. 16, 2013 and based upon and claiming the benefit of priority from Japanese Patent Application No. 2012-280194, filed Dec. 21, 2012, the entire contents of all of which are incorporated herein by reference.

BACKGROUND OF THE INVENTION

1. Field of the Invention

The present invention relates to a curable resin, a method of producing the same, and a cured product.

2. Description of Related Art

Insulating films formed of a resin cured product are often used in electronic devices, and such insulating films are required to have chemical resistance. In recent years, demand for flexible electronic devices represented by electronic papers has grown. Insulating films to be used in such flexible electronic devices are required to have flexibility in addition to chemical resistance.

JP-A-2007-065488 describes a resin composition for forming an insulating film comprising a resin containing hydroxystyrene, an acid generator, a crosslinker such as tetrakis(methoxymethyl)glycoluril, and a silane coupling agent. JP-A-2008-304902 describes a resin composition comprising a resin containing a hydroxystyrene having a specific acetal structure, an acid generator, a crosslinker such as alkoxymethylated glycoluril, and an adhesion aid.

JP-A-H05-158232 describes a composition comprising copolymer of hydroxystyrene and methyl methacrylate, a quinone diazide group-containing compound, a thermosetting resin, and optionally a specific triazine compound. JP-A-H07-140648 describes a thermosetting photosensitive material comprising polyvinyl phenol, a photosensitive material and a melamine-based curing agent.

In the resin compositions described in these patent publications, crosslinking mainly proceeds with a polyfunctional crosslinker or curing agent, and therefore there is a problem that when the amount of the crosslinker or curing agent charged is increased, crosslinking density is made excessively high, so that flexibility is lowered.

BRIEF SUMMARY OF THE INVENTION

An object of the present invention is to provide a curable resin that provides a cured product having both chemical resistance and flexibility, and a method of producing the same.

According to a first aspect of the present invention, there is provided a curable resin including a repeating unit of hydroxystyrene substituted with an alkoxymethyl group, the repeating unit represented by the following general formula (1):

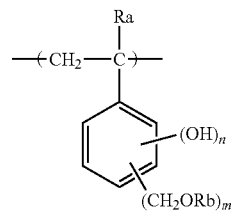

where Ra represents a hydrogen atom or a methyl group; Rb represents a hydrogen atom or an alkyl group having 1 to 4 carbon atoms; m is 1 to 3; and n is 1 to 3.

According to a second aspect of the present invention, there is provided a method of producing the above curable resin, the method including: (a) preparing a polymer of hydroxystyrene or a copolymer of hydroxystyrene and styrene; (b) reacting the polymer or the copolymer with formaldehyde in a presence of an alkali catalyst to introduce a hydroxymethyl group into a benzene ring of the polymer or the copolymer; and (c) reacting a product from (b) with an alcohol having 1 to 4 carbon atoms in a presence of an acid catalyst to alkoxylate the hydroxymethyl group introduced into the benzene ring of the polymer or the copolymer.

According to a third aspect of the present invention, there is provided a cured product produced by curing the above curable resin.

According to the present invention, there are provided a curable resin that provides a cured product having both chemical resistance and flexibility without using an additional crosslinker, and a method of producing the same.

DETAILED DESCRIPTION OF THE INVENTION

A curable resin according to one embodiment of the present invention is a polymer including a repeating unit of hydroxystyrene into which an alkoxymethyl group is introduced. If the polymer is used, alkoxymethyl groups as crosslinking groups can be distributed in the molecule, so that it makes possible to provide a curable resin that provides a cured product having both chemical resistance and flexibility.

Examples of the hydroxystyrene as a monomer include p-hydroxystyrene and m-hydroxystyrene. The hydroxystyrene may have at the α-carbon an alkyl group having 1 to 4 carbon atoms. These monomers may be used alone, or used in combination of two or more types.

A hydroxymethyl group is introduced into a benzene ring of the hydroxystyrene polymer, and the introduced hydroxymethyl group is alkoxylated to provide a curable resin including a repeating unit represented by the following general formula (1):

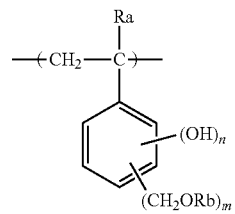

where Ra represents a hydrogen atom or an alkyl group having 1 to 4 carbon atoms; Rb represents a hydrogen atom or an alkyl group having 1 to 4 carbon atoms; m is 1 to 3; and n is 1 to 3.

The curable resin according to the present invention may be, for example, a curable resin including repeating units of hydroxystyrene substituted with an alkoxymethyl group and styrene, the repeating unit represented by the following general formula (2):

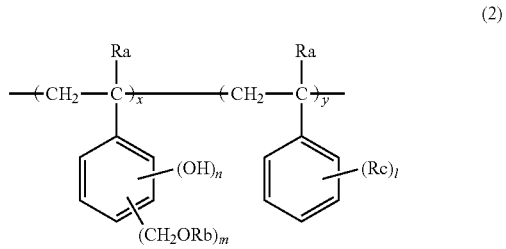

where Ra represents a hydrogen atom or an alkyl group having 1 to 4 carbon atoms; Rb represents a hydrogen atom or an alkyl group having 1 to 4 carbon atoms; Rc represents a hydrogen atom, or an alkyl group or alkoxy group having 1 to 4 carbon atoms, or an aryl group; m is 1 to 3; n is 1 to 3; l is 1 to 3; x is 70 mol % or more; and y is 30 mol % or less. Note that, x is less than 100 mol %, and y is more than 0 mol %.

Here, if y for the styrene repeating unit is more than 30 mol %, solubility in an alkali solution is reduced, which deteriorates pattern developability during fine processing as well as an alkali dissolution rate described later.

In the curable resin according to the present invention, hydroxymethyl groups are not necessarily required to be introduced into all the benzene rings of the hydroxystyrene. That is, the curable resin may include repeating units represented by the following general formula (3):

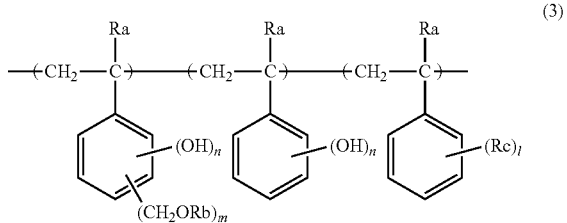

where Ra represents a hydrogen atom or an alkyl group having 1 to 4 carbon atoms; Rb represents a hydrogen atom, or an alkyl group having 1 to 4 carbon atoms; Rc represents a hydrogen atom, or an alkyl group or alkoxy group having 1 to 4 carbon atoms, or an aryl group; m is 1 to 3; n is 1 to 3; and l is 1 to 3. In the general formula (3), the repeating unit of hydroxystyrene substituted with an alkoxymethyl group and the repeating unit of unsubstituted hydroxystyrene accounts for 70 to 100 mol % in total, and the repeating unit of styrene accounts for 0 to 30 mol %.

The ratio of alkoxymethyl groups (molar number of alkoxymethyl group per mole of benzene ring×100) is preferably 10 to 150 mol %, more preferably 15 to 50 mol %. If the ratio of alkoxymethyl groups exceeds the above-mentioned range, chemical resistance is improved, but flexibility is deteriorated. If the ratio of alkoxymethyl groups is below the above-mentioned range, flexibility is improved, but chemical resistance is deteriorated.

The weight average molecular weight (Mw) of the curable resin is desirable to fall within a range of 3,000 to 30,000. If it falls out of the above-mentioned range, handling properties are deteriorated.

The alkali dissolution rate (ADR) preferably ranges from 50 to 3000 Å/sec. If it falls out of the above-mentioned range, pattern developability during fine processing is deteriorated.

Methods for measurement of the ratio of alkoxymethyl groups, and the weight average molecular weight (Mw) and the alkali dissolution rate (ADR) of the curable resin will be described later.

Next, a method of producing the curable resin according to the present invention will be described.

First, a hydroxystyrene polymer is produced by a known method such as radical polymerization using an azo compound.

Formaldehyde is added to and reacted with the resulting hydroxystyrene polymer in the presence of an alkali catalyst such as sodium hydroxide to introduce a hydroxymethyl group into the benzene ring of the hydroxystyrene polymer.

The hydroxystyrene polymer is reacted with an alcohol in the presence of an acid catalyst such as sulfuric acid to alkoxylate the introduced hydroxymethyl group, thereby providing an alkoxymethylated product of hydroxystyrene.

EXAMPLES

The present invention will be described more in detail below by way of Examples, but the present invention is in no way limited to these Examples.

Example 1

In a one litter three-neck flask purged with nitrogen, 88.2 parts by mass of p-tert-butoxystyrene, 88.2 parts by mass of propylene glycol monomethyl ether as a reaction solvent, and 17.2 parts by mass of V-601 (trade name, manufactured by Wako Pure Chemical Industries, Ltd.) as a polymerization initiator were added and dissolved, and reacted under stirring at 80° C. for 8 hours. After completion of the reaction, 10 parts by mass of 35 mass % hydrochloric acid solution was added thereto, and the mixture was reacted under reflux for 6 hours to provide a solution of a p-hydroxystyrene polymer. The resulting solution was added to 580 parts by mass of pure water, and the resulting precipitate was separated by filtration, and dried at 60° C. for 8 hours by a vacuum drier to provide powder of the p-hydroxystyrene polymer. 60 parts by mass of the resulting powder was dissolved in 400 parts by mass of a 10 mass % sodium hydroxide solution, and then 19.6 parts by mass of 92 mass % paraformaldehyde was added, and the mixture was reacted at 40° C. for 5 hours. After the reaction, 140 parts by mass of 30 mass % sulfuric acid solution was added thereto, and the resulting precipitate was collected. 600 parts by mass of methanol was added to the precipitate to dissolve the precipitate, and then 2 parts by mass of 96 mass % sulfuric acid was added, and the mixture was reacted under reflux for 8 hours. After the reaction, the reaction product was concentrated under reduced pressure to distill away methanol, 400 parts by mass of pure water was added thereto, and the resulting precipitate was collected. 200 parts by mass of gamma-butyrolactone was added to the precipitate to dissolve the precipitate, and residual methanol and pure water were distilled away under reduced pressure to provide a gamma-butyrolactone solution of a methoxymethylated product of the p-hydroxystyrene polymer. The resulting methoxymethylated product of p-hydroxystyrene had a weight average molecular weight of 5,700 as measured by GPC, an alkali dissolution rate of 2,040 Å/second as measured by using a 2.38 mass % tetramethylammonium hydroxide solution, and a ratio of crosslinking groups of 32 mol % as measured by 13C-NMR.

Example 2

The same production method as in Example 1 was carried out except that 74.9 parts by mass of p-tert-butoxystyrene and 7.8 parts by mass of styrene were used in place of 88.2 parts by mass of p-tert-butoxystyrene. The resulting methoxymethylated product of a p-hydroxystyrene/styrene copolymer had a weight average molecular weight of 7,900 as measured by CPC, an alkali dissolution rate of 670 Å/second as measured by using a 2.38 mass % tetramethylammonium hydroxide solution, and a ratio of crosslinking groups of 56 mol % as measured by 13C-NMR.

Example 3

The same production method as in Example 1 was carried out except that 66.1 parts by mass of p-tert-butoxystyrene and 13 parts by mass of styrene were used in place of 88.2 parts by mass of p-tert-butoxystyrene. The resulting methoxymethylated product of a p-hydroxystyrene/styrene copolymer had a weight average molecular weight of 8,100 as measured by GPC, an alkali dissolution rate of 170 Å/second as measured by using a 2.38 mass % tetramethylammonium hydroxide solution, and a ratio of crosslinking groups of 53 mol % as measured by 13C-NMR.

Example 4

The same production method as in Example 1 was carried out except that 79.3 parts by mass of m-tert-butoxystyrene and 5.2 parts by mass of styrene were used in place of 88.2 parts by mass of p-tert-butoxystyrene. The resulting methoxymethylated product of a m-hydroxystyrene/styrene copolymer had a weight average molecular weight of 15,000 as measured by GPC, an alkali dissolution rate of 560 Å/second as measured by using a 2.38 mass % tetramethylammonium hydroxide solution, and a ratio of crosslinking groups of 41 mol % as measured by 13C-NMR.

Example 5

The same production method as in Example 1 was carried out except that 70.5 parts by mass of m-tert-butoxystyrene and 10.4 parts by mass of styrene were used in place of 88.2 parts by mass of p-tert-butoxystyrene. The resulting methoxymethylated product of a m-hydroxystyrene/styrene copolymer had a weight average molecular weight of 22,000 as measured by GPC, an alkali dissolution rate of 160 Å/second as measured by using a 2.38 mass % tetramethylammonium hydroxide solution, and a ratio of crosslinking groups of 42 mol % as measured by 13C-NMR.

Example 6

The same production method as in Example 3 was carried out except that 15.7 parts by mass of 92 mass % paraformaldehyde was used in place of 19.6 parts by mass of 92 mass % paraformaldehyde. The resulting methoxymethylated product of a p-hydroxystyrene/styrene copolymer had a weight average molecular weight of 6,500 as measured by GPC, an alkali dissolution rate of 170 Å/second as measured by using a 2.38 mass % tetramethylammonium hydroxide solution, and a ratio of crosslinking groups of 32 mol % as measured by 13C-NMR.

Example 7

The same production method as in Example 3 was carried out except that 118 parts by mass of 92 mass % paraformaldehyde was used in place of 19.6 parts by mass of 92 mass % paraformaldehyde. The resulting methoxymethylated product of a p-hydroxystyrene/styrene copolymer had a weight average molecular weight of 5,400 as measured by GPC, an alkali dissolution rate of 190 Å/second as measured by using a 2.38 mass % tetramethylammonium hydroxide solution, and a ratio of crosslinking groups of 21 mol % as measured by 13C-NMR.

Example 8

The same production method as in Example 3 was carried out except that 7.8 parts by mass of 92 mass % paraformaldehyde was used in place of 19.6 parts by mass of 92 mass % paraformaldehyde. The resulting methoxymethylated product of a p-hydroxystyrene/styrene copolymer had a weight average molecular weight of 4,600 as measured by GPC, an alkali dissolution rate of 230 Å/second as measured by using a 2.38 mass % tetramethylammonium hydroxide solution, and a ratio of crosslinking groups of 9 mol % as measured by 13C-NMR.

Example 9

The same production method as in Example 7 was carried out except that 10.3 parts by mass of V-601 was used in place of 17.2 parts by mass of V-601. The resulting methoxymethylated product of a p-hydroxystyrene/styrene copolymer had a weight average molecular weight of 9,500 as measured by GPC, an alkali dissolution rate of 80 Å/second as measured by using a 2.38 mass % tetramethylammonium hydroxide solution, and a ratio of crosslinking groups of 23 mol % as measured by 13C-NMR.

Example 10

The same production method as in Example 7 was carried out except that 6.9 parts by mass of V-601 was used in place of 17.2 parts by mass of V-601. The resulting methoxymethylated product of a p-hydroxystyrene/styrene copolymer had a weight average molecular weight of 18,300 as measured by GPC, an alkali dissolution rate of 60 Å/second as measured by using a 2.38 mass % tetramethylammonium hydroxide solution, and a ratio of crosslinking groups of 24 mol % as measured by 13C-NMR.

Example 11

The same production method as in Example 7 was carried out except that 18.9 parts by mass of 2,2'-azobisisobutyronitrile was used in place of 17.2 parts by mass of V-601. The resulting methoxymethylated product of a p-hydroxystyrene/styrene copolymer had a weight average molecular weight of 6,400 as measured by GPC, an alkali dissolution rate of 250 Å/second as measured by using a 2.38 mass % tetramethylammonium hydroxide solution, and a ratio of crosslinking groups of 23 mol % as measured by 13C-NMR.

Example 12

The same production method as in Example 3 was carried out except that 30.3 parts by mass of 92 mass % paraformaldehyde was used in place of 19.6 parts by mass of 92 mass % paraformaldehyde. The resulting methoxymethylolated product of a p-hydroxystyrene/styrene copolymer had a weight average molecular weight of 12,000 as measured by GPC, an alkali dissolution rate of 150 Å/second as measured by using a 2.38 mass % tetramethylammonium hydroxide solution, and a ratio of crosslinking groups of 82 mol % as measured by 13C-NMR.

Example 13

The same production method as in Example 1 was carried out except that 10.3 parts by mass of V-601 was used in place of 17.2 parts by mass of V-601, and 75.8 parts by mass of 92 mass % paraformaldehyde was used in place of 19.6 parts by mass of 92 mass % paraformaldehyde. The resulting methoxymethylated product of p-hydroxystyrene had a weight average molecular weight of 23,000 as measured by GPC, an alkali dissolution rate of 1,500 Å/second as measured by using a 2.38 mass % tetramethylammonium hydroxide solution, and a ratio of crosslinking groups of 124 mol % as measured by 13C-NMR Example 14

The same production method as in Example 13 was carried out except that 59.9 parts by mass of 92 mass % paraformaldehyde was used in place of 19.6 parts by mass of 92 mass % paraformaldehyde. The resulting methoxymethylated product of a p-hydroxystyrene polymer had a weight average molecular weight of 12,600 as measured by GPC, an alkali dissolution rate of 1,750 Å/second as measured by using a 2.38 mass % tetramethylammonium hydroxide solution, and a ratio of crosslinking groups of 98 mol % as measured by 13C-NMR.

Example 15

The same production method as in Example 1 was carried out except that 10.3 parts by mass of V-601 was used in place of 17.2 parts by mass of V-601, and ethanol was used in place of methanol. The resulting ethoxymethylated product of a p-hydroxystyrene polymer had a weight average molecular weight of 12,000 as measured by GPC, an alkali dissolution rate of 1,650 Å/second as measured by using a 2.38 mass % tetramethylammonium hydroxide solution, and a ratio of crosslinking groups of 34 mol % as measured by 13C-NMR.

Example 16

The same production method as in Example 1 was carried out except that 10.3 parts by mass of V-601 was used in place of 17.2 parts by mass of V-601, and normal butanol was used in place of methanol. The resulting buthoxymethylated product of a p-hydroxystyrene polymer had a weight average molecular weight of 12,300 as measured by GPC, an alkali dissolution rate of 1,420 Å/second as measured by using a 2.38 mass % tetramethylammonium hydroxide solution, and a ratio of crosslinking groups of 36 mol % as measured by 13C-NMR.

Example 17

The same production method as in Example 1 was carried out except that 10.3 parts by mass of V-601 was used in place of 17.2 parts by mass of V-601, and isopropanol was used in place of methanol. The resulting isopropoxymethylated product of a p-hydroxystyrene polymer had a weight average molecular weight of 12,300 as measured by GPC, an alkali dissolution rate of 1,530 Å/second as measured by using a 2.38 mass % tetramethylammonium hydroxide solution, and a ratio of crosslinking groups of 42 mol % as measured by 13C-NMR.

Comparative Example 1

In a one litter three-neck flask purged with nitrogen, 88.2 parts by mass of p-tert-butoxystyrene, 88.2 parts by mass of propylene glycol monomethyl ether as a reaction solvent, and 10.3 parts by mass of V-601 as a polymerization initiator were added and dissolved, and reacted under stirring at 80° C. for 8 hours. After completion of the reaction, 10 parts by mass of 35 mass % hydrochloric acid solution was added thereto, and the mixture was reacted under reflux for 6 hours to provide a propylene glycol monomethyl ether solution of a p-hydroxystyrene polymer. The resulting solution was added to 580 parts by mass of pure water, and the resulting precipitate was separated by filtration, and dried at 60° C. for 8 hours by a vacuum drier to provide powder of the p-hydroxystyrene polymer. 60 parts by mass of the resulting powder was dissolved in 150 parts by mass of gamma-butyrolactone, and 3 parts by mass of tetrakis(methoxymethyl)glycoluril was added as a crosslinker to prepare a gamma-butyrolactone solution of a thermosetting resin composition.

Comparative Example 2

The same production method as in Comparative Example 1 was carried out except that 6 parts by mass of tetrakis(methoxymethyl)glycoluril was used in place of 3 parts by mass of tetrakis(methoxymethyl)glycoluril to prepare a gamma-butyrolactone solution of a thermosetting resin composition.

Comparative Example 3

The same production method as in Comparative Example 1 was carried out except that 18 parts by mass of tetrakis(methoxymethyl)glycoluril was used in place of 3 parts by mass of tetrakis(methoxymethyl)glycoluril to prepare a gamma-butyrolactone solution of a thermosetting resin composition.

The following measurements and evaluations were performed for Examples 1 to 17 and Comparative Examples 1 to 3.

[Measurement of Alkali Dissolution Rate (ADR)]

Each of the varnishes prepared in Examples 1 to 17 and the solutions prepared in Comparative Examples 1 to 3 was applied to a 3.5-inch silicon wafer using a spin coater, and then pre-baked at 110° C. for minute using a hot plate, and a film thickness thereof was measured using an interferometry film thickness measurement system AFT M5100 manufactured by Nanometrics Inc. The silicon wafer having the coated film was immersed in a 2.38 mass % tetramethylammonium hydroxide solution, and a time required for completely dissolving the coated film was measured. An alkali dissolution rate was calculated in accordance with the Equation 1:

$$ADR = Tpre/DT \quad \text{(Equation 1)},$$

where ADR represents an alkali dissolution rate (Å/second), Tpre represents a film thickness (Å) after pre-baking, and DT is a time (seconds) required for dissolution.

[Calculation of Weight Average Molecular Weight (Mw)]

A weight average molecular weight was measured using a gel permeation chromatograph HLC-8220 GPC manufactured by TOSOH CORPORATION. For the weight average molecular weight, a numerical value calculated by conversion based on polystyrene.

[Calculation of Ratio of Crosslinking Groups]

Measurement was performed in a 13C-quantitative mode using NMR LA-400 manufactured by JEOL Ltd. As a ratio of crosslinking (CL) groups, a ratio of alkoxymethyl groups was calculated on the basis of a peak of benzene rings. In this measurement, the ratio of crosslinking groups is given as a mole percentage (mol %) calculated from (molar number of alkoxymethyl group per mole of benzene ring)× 100.

For Comparative Examples 1 to 3, the ratio of crosslinkers is given as a mole percentage (mol %) calculated from (molar number of alkoxymethyl group per mole of benzene ring)×100.

[Evaluation of Solvent Resistance]

Each of the varnishes prepared in Examples 1 to 17 and the solutions prepared in Comparative Examples 1 to 3 was applied to a 3.5-inch silicon wafer using a spin coater, then pre-baked at 120° C. for 3 minutes using a hot plate, and heat-cured at 180° C. for 2 hours using an oven, thereby providing a cured film. For the cured film, a film thickness thereof was measured using an interferometry film thickness measurement system AFT M5100 manufactured by Nanometrics Inc. The resulting cured film was immersed in acetone for 2 hours, and dried, and a film thickness thereof was measured again. Comparison of the film thickness before and after immersion in acetone, and solvent resistance was evaluated. A rate of change in film thickness was calculated, and the value below ±5% was evaluated as "good", the value of ±5% to ±10% was evaluated as "medium", and the value above ±10% or the case where the cured film was peeled was evaluated as "poor".

[Evaluation of Flexibility]

Each of the varnishes prepared in Examples 1 to 17 and the solutions prepared in Comparative Examples 1 to 3 was applied to an aluminum plate in a thickness of 1 μm using a bar coater, and pre-baked at 180° C. for 2 hours using an oven, thereby providing a cured film. The plate was bent at 45° and 90° with the resulting cured film on the outer side, and flexibility was evaluated. The case where cracking did not occur under bending at 90° was evaluated as "good", the case where cracking did not occur under bending at 45° was evaluated as "medium", and the case where cracking occurred under bending at 45° was evaluated as "poor".

The above data are shown in Table 1.

From Table 1, it is known that the cured products of Examples 1 to 17 are excellent in both solvent resistance (chemical resistance) and flexibility.

TABLE 1

| | | Amounts of monomer components (charged mol %) | | | CL group or Crosslinker | Ratio of CL group or Crosslinker/ mol % | Mw | ADR Å/sec | Solvent resistance | Flexibility |
|---|---|---|---|---|---|---|---|---|---|---|
| | | PHS | MHS | St | | | | | | |
| Examples | 1 | 100 | | | —CH2OCH3 | 32 | 5700 | 2040 | good | good |
| | 2 | 85 | | 15 | —CH2OCH3 | 56 | 7900 | 670 | good | medium |
| | 3 | 75 | | 25 | —CH2OCH3 | 53 | 8100 | 170 | good | medium |
| | 4 | | 90 | 10 | —CH2OCH3 | 41 | 16000 | 560 | good | good |
| | 5 | | 80 | 20 | —CH2OCH3 | 42 | 22000 | 160 | good | good |
| | 6 | 75 | | 25 | —CH2OCH3 | 32 | 6500 | 170 | good | good |
| | 7 | 75 | | 25 | —CH2OCH3 | 21 | 5400 | 190 | good | good |
| | 8 | 75 | | 25 | —CH2OCH3 | 9 | 4600 | 230 | good | good |
| | 9 | 75 | | 25 | —CH2OCH3 | 23 | 9500 | 80 | good | good |
| | 10 | 75 | | 25 | —CH2OCH3 | 24 | 18300 | 60 | good | good |
| | 11 | 75 | | 25 | —CH2OCH3 | 23 | 6400 | 250 | good | good |
| | 12 | 75 | | 25 | —CH2OCH3 | 82 | 12000 | 150 | good | medium |
| | 13 | 100 | | | —CH2OCH3 | 124 | 23000 | 1500 | good | medium |
| | 14 | 100 | | | —CH2OCH3 | 98 | 12600 | 1750 | good | medium |
| | 15 | 100 | | | —CH2OC2H5 | 34 | 12000 | 1650 | good | good |
| | 16 | 100 | | | —CH2OC4H9 | 36 | 12300 | 1420 | good | good |
| | 17 | 100 | | | —CH2OCH(CH3)2 | 42 | 12300 | 1530 | good | good |
| Comparative Examples | 1 | 100 | | | tetrakis(methoxymethyl)glycoluryl | 8 (calcd) | 15000 | 2200 | poor | medium |
| | 2 | 100 | | | tetrakis(methoxymethyl)glycoluryl | 15 (calcd) | 15000 | 2140 | good | poor |
| | 3 | 100 | | | tetrakis(methoxymethyl)glycoluryl | 30 (calcd) | 15000 | 2560 | good | poor |

What is claimed is:

1. A method of producing a curable resin comprising a repeating unit of hydroxystyrene substituted with an alkoxymethyl group, the repeating unit represented by the following general formula (1):

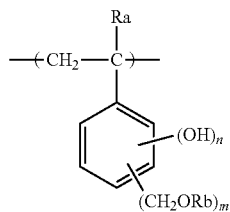

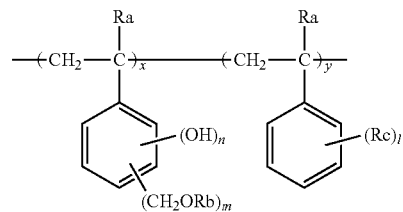

where Ra represents a hydrogen atom or a methyl group; Rb represents a hydrogen atom or an alkyl group having 1 to 4 carbon atoms; m is 1 to 3; and n is 1 to 3, the method comprising:
(a) preparing a polymer of hydroxystyrene
(b) reacting the polymer with formaldehyde in a presence of an alkali catalyst to introduce a hydroxymethyl group into a benzene ring of the polymer; and
(c) reacting a product from (b) with an alcohol having 1 to 4 carbon atoms in a presence of an acid catalyst to alkoxylate the hydroxymethyl group introduced into the benzene ring of the polymer.

2. A method of producing a curable resin comprising repeating units of hydroxystyrene substituted with an alkoxymethyl group and styrene, the repeating units represented by the following general formula (2):

where Ra represents a hydrogen atom or a methyl group; Rb represents a hydrogen atom or an alkyl group having 1 to 4 carbon atoms; m is 1 to 3; n is 1 to 3; Rc represents a hydrogen atom, or an alkyl group or alkoxy group having 1 to 4 carbon atoms, or an aryl group; l is 1 to 3; x is 70 mold or more; and y is 30 mol % or less, the method comprising:
(a) preparing a copolymer of hydroxystyrene and styrene;
(b) reacting the copolymer with formaldehyde in the presence of an alkali catalyst to introduce a hydroxymethyl group into a benzene ring of the copolymer; and
(c) reacting a product from (b) with an alcohol having 1 to 4 carbon atoms in a presence of an acid catalyst to alkoxylate the hydroxymethyl group introduced into the benzene ring of the copolymer.

* * * * *